United States Patent
Oda et al.

(10) Patent No.: US 12,374,866 B2
(45) Date of Patent: Jul. 29, 2025

(54) BEAM DEFLECTION SYSTEM

(71) Applicant: DENSO CORPORATION, Kariya (JP)

(72) Inventors: Toshihiro Oda, Kariya (JP); Yuki Kamata, Kariya (JP); Koichi Oyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 696 days.

(21) Appl. No.: 17/319,230

(22) Filed: May 13, 2021

(65) Prior Publication Data

US 2021/0373350 A1 Dec. 2, 2021

(30) Foreign Application Priority Data

May 27, 2020 (JP) ................. 2020-092384

(51) Int. Cl.
*H01S 5/40* (2006.01)
*G02B 27/10* (2006.01)
*H01S 5/34* (2006.01)

(52) U.S. Cl.
CPC ........ *H01S 5/4012* (2013.01); *G02B 27/1006* (2013.01); *H01S 5/3412* (2013.01); *H01S 5/4087* (2013.01)

(58) Field of Classification Search
CPC .... H01S 5/4012; H01S 5/3412; H01S 5/4087; H01S 5/142; H01S 5/0071; G02B 27/1006; G02B 26/0808; G01S 7/4815; G01S 7/4817; G01S 17/42
See application file for complete search history.

(56) References Cited

U.S. PATENT DOCUMENTS

| | | | |
|---|---|---|---|
| 5,365,535 A | 11/1994 | Yamaguchi et al. | |
| 2008/0151949 A1* | 6/2008 | Takeda | H04N 9/3161 372/22 |
| 2016/0149374 A1* | 5/2016 | Chann | H01S 5/4087 372/23 |
| 2018/0269654 A1* | 9/2018 | Zhang | H01S 5/1096 |
| 2019/0204419 A1* | 7/2019 | Baba | G02B 6/124 |

FOREIGN PATENT DOCUMENTS

| | | | |
|---|---|---|---|
| JP | H0669577 A | * | 3/1994 |
| JP | 2011-85610 A | | 4/2011 |

* cited by examiner

*Primary Examiner* — Ricky L Mack
*Assistant Examiner* — K Muhammad
(74) *Attorney, Agent, or Firm* — Posz Law Group, PLC

(57) ABSTRACT

A beam deflection system includes 2M laser light sources configured to emit laser lights, each laser light source being configured to switch two different center wavelengths to each other. The 2M laser light sources are divided into two sets of M types. The laser lights emitted from the two sets of M types of laser light sources are combined and input to a beam deflector. When (i) N is defined as an integer satisfying an expression of "1≤N≤M", and (ii) center wavelengths of Nth laser light sources of the two sets of M laser light sources are defined as λN and λM+N, an expression of "λ1< ... <λN< ... <λM<λM+1< ... <λM+N< ... <λ2M" is satisfied.

20 Claims, 17 Drawing Sheets

COMPARATIVE

COMPARATIVE

COMPARATIVE

FIG. 5

COMPARATIVE

| ALLOCATION | 1ST L L SOURCE J11 CENTER WAVELENGTH $\lambda 1$ | 2ND L L SOURCE J12 CENTER WAVELENGTH $\lambda 2$ | 3RD L L SOURCE J13 CENTER WAVELENGTH $\lambda 3$ | 4TH L L SOURCE J14 CENTER WAVELENGTH $\lambda 4$ | TOTAL |
|---|---|---|---|---|---|
| SCAN RANGE (1) | ✓ | — | — | — | 1 |
| SCAN RANGE (2) | — | ✓ | — | — | 1 |
| SCAN RANGE (3) | — | — | ✓ | — | 1 |
| SCAN RANGE (4) | — | — | — | ✓ | 1 |

FIG. 8

NORMAL SCAN

| ALLOCATION | 1ST L L SOURCE 11 CENTER WAVELENGTH $\lambda 1$ | 2ND L L SOURCE 12 CENTER WAVELENGTH $\lambda 2$ | 3RD L L SOURCE 13 CENTER WAVELENGTH $\lambda 3$ | 4TH L L SOURCE 14 CENTER WAVELENGTH $\lambda 4$ | TOTAL |
|---|---|---|---|---|---|
| SCAN RANGE (1) | ✓ | — | — | — | 1 |
| SCAN RANGE (2) | — | ✓ | — | — | 1 |
| SCAN RANGE (3) | — | — | ✓ | — | 1 |
| SCAN RANGE (4) | — | — | — | ✓ | 1 |

FIG. 9

SCAN CONCENTRATED ON SCAN RANGES (1) (2)

| ALLOCATION | 1ST L L SOURCE 11 CENTER WAVELENGTH $\lambda 1$ | 2ND L L SOURCE 12 CENTER WAVELENGTH $\lambda 2$ | 3RD L L SOURCE 13 CENTER WAVELENGTH $\lambda 1$ | 4TH L L SOURCE 14 CENTER WAVELENGTH $\lambda 2$ | TOTAL |
|---|---|---|---|---|---|
| SCAN RANGE (1) | ✓ | — | ✓ | — | 2 |
| SCAN RANGE (2) | — | ✓ | — | ✓ | 2 |
| SCAN RANGE (3) | — | — | — | — | 0 |
| SCAN RANGE (4) | — | — | — | — | 0 |

FIG. 10

SCAN CONCENTRATED ON SCAN RANGES (3) (4)

| ALLOCATION | 1ST L L SOURCE 11 CENTER WAVELENGTH $\lambda 3$ | 2ND L L SOURCE 12 CENTER WAVELENGTH $\lambda 4$ | 3RD L L SOURCE 13 CENTER WAVELENGTH $\lambda 3$ | 4TH L L SOURCE 14 CENTER WAVELENGTH $\lambda 4$ | TOTAL |
|---|---|---|---|---|---|
| SCAN RANGE (1) | — | — | — | — | 0 |
| SCAN RANGE (2) | — | — | — | — | 0 |
| SCAN RANGE (3) | ✓ | — | ✓ | — | 2 |
| SCAN RANGE (4) | — | ✓ | — | ✓ | 2 |

FIG. 11

SCAN CONCENTRATED ON SCAN RANGES (2) (3)

| ALLOCATION | 1ST L L SOURCE 11 CENTER WAVELENGTH $\lambda 3$ | 2ND L L SOURCE 12 CENTER WAVELENGTH $\lambda 2$ | 3RD L L SOURCE 13 CENTER WAVELENGTH $\lambda 3$ | 4TH L L SOURCE 14 CENTER WAVELENGTH $\lambda 2$ | TOTAL |
|---|---|---|---|---|---|
| SCAN RANGE (1) | — | — | — | — | 0 |
| SCAN RANGE (2) | — | ✓ | — | ✓ | 2 |
| SCAN RANGE (3) | ✓ | — | ✓ | — | 2 |
| SCAN RANGE (4) | — | — | — | — | 0 |

FIG. 15

NORMAL SCAN

| ALLOCATION | 1ST L L SOURCE 11 CENTER WAVELENGTH $\lambda1$ | 2ND L L SOURCE 12 CENTER WAVELENGTH $\lambda2$ | 3RD L L SOURCE 13 CENTER WAVELENGTH $\lambda3$ | 4TH L L SOURCE 14 CENTER WAVELENGTH $\lambda4$ | 5TH L L SOURCE 15 CENTER WAVELENGTH $\lambda5$ | 6TH L L SOURCE 16 CENTER WAVELENGTH $\lambda6$ | TOTAL |
|---|---|---|---|---|---|---|---|
| SCAN RANGE (1) | ✓ | — | — | — | — | — | 1 |
| SCAN RANGE (2) | — | ✓ | — | — | — | — | 1 |
| SCAN RANGE (3) | — | — | ✓ | — | — | — | 1 |
| SCAN RANGE (4) | — | — | — | ✓ | — | — | 1 |
| SCAN RANGE (5) | — | — | — | — | ✓ | — | 1 |
| SCAN RANGE (6) | — | — | — | — | — | ✓ | 1 |

FIG. 16

SCAN CONCENTRATED ON SCAN RANGES (1) (2) (3)

| ALLOCATION | 1ST L L SOURCE 11 CENTER WAVELENGTH $\lambda 1$ | 2ND L L SOURCE 12 CENTER WAVELENGTH $\lambda 2$ | 3RD L L SOURCE 13 CENTER WAVELENGTH $\lambda 3$ | 4TH L L SOURCE 14 CENTER WAVELENGTH $\lambda 1$ | 5TH L L SOURCE 15 CENTER WAVELENGTH $\lambda 2$ | 6TH L L SOURCE 16 CENTER WAVELENGTH $\lambda 3$ | TOTAL |
|---|---|---|---|---|---|---|---|
| SCAN RANGE (1) | ✓ | — | — | — | — | — | 2 |
| SCAN RANGE (2) | — | ✓ | — | — | ✓ | — | 2 |
| SCAN RANGE (3) | — | — | ✓ | — | — | ✓ | 2 |
| SCAN RANGE (4) | — | — | — | — | — | — | 0 |
| SCAN RANGE (5) | — | — | — | — | — | — | 0 |
| SCAN RANGE (6) | — | — | — | — | — | — | 0 |

FIG. 17

SCAN CONCENTRATED ON SCAN RANGES (4) (5) (6)

| ALLOCATION | 1ST L L SOURCE 11 CENTER WAVELENGTH $\lambda 4$ | 2ND L L SOURCE 12 CENTER WAVELENGTH $\lambda 5$ | 3RD L L SOURCE 13 CENTER WAVELENGTH $\lambda 6$ | 4TH L L SOURCE 14 CENTER WAVELENGTH $\lambda 4$ | 5TH L L SOURCE 15 CENTER WAVELENGTH $\lambda 5$ | 6TH L L SOURCE 16 CENTER WAVELENGTH $\lambda 6$ | TOTAL |
|---|---|---|---|---|---|---|---|
| SCAN RANGE (1) | — | — | — | — | — | — | 0 |
| SCAN RANGE (2) | — | — | — | — | — | — | 0 |
| SCAN RANGE (3) | — | — | — | — | — | — | 0 |
| SCAN RANGE (4) | ✓ | — | — | ✓ | — | — | 2 |
| SCAN RANGE (5) | — | ✓ | — | — | ✓ | — | 2 |
| SCAN RANGE (6) | — | — | ✓ | — | — | ✓ | 2 |

FIG. 18

SCAN CONCENTRATED ON SCAN RANGES (2) (3) (4)

| ALLOCATION | 1ST L L SOURCE 11 CENTER WAVELENGTH λ4 | 2ND L L SOURCE 12 CENTER WAVELENGTH λ2 | 3RD L L SOURCE 13 CENTER WAVELENGTH λ3 | 4TH L L SOURCE 14 CENTER WAVELENGTH λ4 | 5TH L L SOURCE 15 CENTER WAVELENGTH λ2 | 6TH L L SOURCE 16 CENTER WAVELENGTH λ3 | TOTAL |
|---|---|---|---|---|---|---|---|
| SCAN RANGE (1) | — | — | — | — | — | — | 0 |
| SCAN RANGE (2) | — | ✓ | — | — | ✓ | — | 2 |
| SCAN RANGE (3) | — | — | ✓ | — | — | ✓ | 2 |
| SCAN RANGE (4) | ✓ | — | — | ✓ | — | — | 2 |
| SCAN RANGE (5) | — | — | — | — | — | — | 0 |
| SCAN RANGE (6) | — | — | — | — | — | — | 0 |

FIG. 19

SCAN CONCENTRATED ON SCAN RANGES (3) (4) (5)

| ALLOCATION | 1ST L L SOURCE 11 CENTER WAVELENGTH λ4 | 2ND L L SOURCE 12 CENTER WAVELENGTH λ5 | 3RD L L SOURCE 13 CENTER WAVELENGTH λ3 | 4TH L L SOURCE 14 CENTER WAVELENGTH λ4 | 5TH L L SOURCE 15 CENTER WAVELENGTH λ5 | 6TH L L SOURCE 16 CENTER WAVELENGTH λ3 | TOTAL |
|---|---|---|---|---|---|---|---|
| SCAN RANGE (1) | — | — | — | — | — | — | 0 |
| SCAN RANGE (2) | — | — | — | — | — | — | 0 |
| SCAN RANGE (3) | ✓ | — | — | — | — | ✓ | 2 |
| SCAN RANGE (4) | — | ✓ | — | ✓ | — | — | 2 |
| SCAN RANGE (5) | — | — | — | — | ✓ | — | 2 |
| SCAN RANGE (6) | — | — | — | — | — | — | 0 |

FIG. 23

| LASER LIGHT SOURCE | CENTER WAVELENGTH (nm) | LOWER LIMIT OF TUNABLE WAVELENGTH (nm) | UPPER LIMIT OF TUNABLE WAVELENGTH (nm) |
|---|---|---|---|
| 1ST LASER LIGHT SOURCE | 1215 (=$\lambda 1$) | 1200 | 1230 |
| 2ND LASER LIGHT SOURCE | 1245 (=$\lambda 2$) | 1230 | 1260 |
| 3RD LASER LIGHT SOURCE | 1275 (=$\lambda 3$) | 1260 | 1290 |
| 4TH LASER LIGHT SOURCE | 1305 (=$\lambda 4$) | 1290 | 1320 |
| 5TH LASER LIGHT SOURCE | 1335 (=$\lambda 5$) | 1320 | 1350 |
| 6TH LASER LIGHT SOURCE | 1365 (=$\lambda 6$) | 1350 | 1380 |

BEAM DEFLECTION SYSTEM

CROSS REFERENCE TO RELATED APPLICATION

The present application is based on Japanese Patent Application No. 2020-092384 filed on May 27, 2020, the disclosure of which is incorporated herein by reference.

TECHNICAL FIELD

The present disclosure relates to a beam deflection system capable of achieving scan concentration over a particular scanning range.

BACKGROUND

There is proposed an optical deflection device as a beam deflection system. This light deflection device is configured to be capable of concurrently scanning a plurality of scanning ranges using a plurality of tunable laser light sources. Due to the limitation of the wavelength tunable range of the tunable laser light source, it is not possible to cover a wide scanning range with one laser beam. Therefore, in this light deflection device, the entire scanning range is shared by providing a plurality of laser light sources. Specifically, laser beams output from a plurality of laser light sources having different wavelengths are introduced into a beam polarizer to form an emitter that emits light at an emission angle corresponding to each wavelength. As a result, a plurality of scanning ranges can be scanned concurrently.

SUMMARY

A beam deflection system includes 2M laser light sources configured to emit laser lights, each laser light source being configured to switch two different center wavelengths to each other. The 2M laser light sources are divided into two sets of M types. The laser lights emitted from the two sets of M types of laser light sources are combined and input to a beam deflector. When (i) N is defined as an integer satisfying an expression of "1≤N≤M", and (ii) the center wavelengths of Nth laser light sources of the two sets of M laser light sources are defined as λN and λM+N, an expression of "λ1< . . . <λN< . . . <λM<λM+1< . . . <λM+N< . . . <λ2M" is satisfied.

BRIEF DESCRIPTION OF DRAWINGS

The objects, features, and advantages of the present disclosure will become more apparent from the following detailed description made with reference to the accompanying drawings. In the drawings:

FIG. 5 is a diagram showing scan allocations and scanning ranges of the beam deflection system of the comparative example;

FIG. 8 is a diagram showing scan allocations and scanning ranges during normal scanning of the beam deflection system according to the first embodiment;

FIG. 9 is a diagram showing scan allocations and scanning ranges at concentrated scanning to the scanning ranges (1) and (2) of the beam deflection system according to the first embodiment;

FIG. 10 is a diagram showing scan allocations and scanning ranges at concentrated scanning to the scanning ranges (3) and (4) of the beam deflection system according to the first embodiment;

FIG. 11 is a diagram showing scan allocations and scanning ranges at concentrated scanning to the scanning ranges (2) and (3) of the beam deflection system according to the first embodiment;

FIG. 15 is a diagram showing scan allocations and scanning ranges during normal scanning of the beam deflection system according to the second embodiment;

FIG. 16 is a diagram showing scan allocation and scanning range at concentrated scanning to scanning ranges (1) to (3) of the beam deflection system according to the second embodiment;

FIG. 17 is a diagram showing scan allocations and scanning ranges at the time of concentrated scanning to scanning ranges (4) to (6) of the beam deflection system according to the second embodiment;

FIG. 18 is a diagram showing scan allocations and scanning ranges at concentrated scanning to scanning ranges (2) to (4) of the beam deflection system according to the second embodiment;

FIG. 19 is a diagram showing scan allocations and scanning ranges at concentrated scanning to scanning ranges (3) to (5) of the beam deflection system according to the second embodiment;

FIG. 23 is a diagram showing the center wavelengths of first to sixth laser light sources and the lower and upper limits of tunable wavelength according to the third embodiment.

DETAILED DESCRIPTION

Hereinafter, embodiments of the present disclosure will be described with reference to the drawings. In the following embodiments, the same or equivalent parts are denoted by the same reference signs.

First Embodiment

A beam deflection system according to a first embodiment will be described. This beam deflection system is applied to, for example, laser radar or LiDAR (Light Detection And Ranging).

Figure 1:
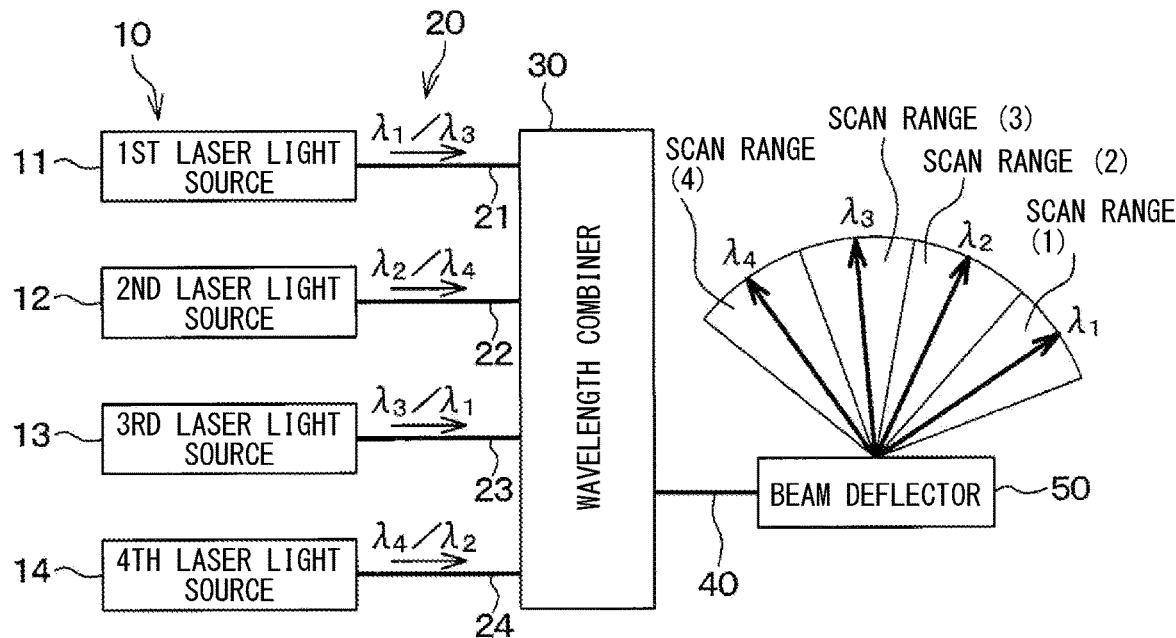
FIG. 1 is a diagram showing a schematic configuration of a beam deflection system according to a first embodiment.

As shown in FIG. 1, the beam deflection system is configured to include laser light sources 10, waveguides 20, a wavelength combiner 30, a waveguide 40, and a beam deflector 50.

The laser light sources 10 are composed of, for example, a semiconductor laser. In the present embodiment, the laser light sources 10 are configured to have first to fourth laser light sources 11 to 14. Note that the laser light sources 10 may be also referred to as a laser light source unit 10 to differentiate from each of the first to fourth laser light sources 11 to 14. Details of the laser light sources 10 will be described later.

The waveguides 20 connect the laser light sources 10 and the wavelength combiner 30, and serve as optical waveguides that propagate the laser lights output from the laser light sources 10 to the wavelength combiner 30. In the present embodiment, the waveguides 20 are provided to be sandwiched between the laser light sources 20 and the wavelength combiner 30. The waveguides 20 include first to fourth waveguides 21 to 24, which respectively correspond to and are connected to the first to fourth laser light sources 11 to 14. The first to fourth waveguides 21 to 24 propagate the laser lights output from the first to fourth laser light sources 11 to 14 to the wavelength combiner 30. Note that the waveguides 20 may be also referred to as a waveguide unit 20 to differentiate from each of the first to fourth waveguides 21 to 24.

The wavelength combiner 30 combines the laser lights from the first to fourth laser light sources 11 to 14 propagated through the waveguides 20, and outputs the combined laser light to the waveguide 40.

The waveguide 40 serves as an optical waveguide that propagates the combined laser light output from the wavelength combiner 30 to the beam deflector 50.

The beam deflector 50 is composed of, for example, a grating coupler or the like, and emits a laser beam having a scanning range corresponding to the wavelength of the combined wave laser light propagated from the waveguide 40. By concurrently emitting laser beams of a plurality of wavelengths from the beam deflector 50, the laser beams can be concurrently emitted to a plurality of scanning ranges.

Subsequently, the details of the laser light sources 10 will be described while showing the difference from a known laser light source.

In the present embodiment, the laser light sources 10 include two set of laser light sources being (i) a first set of the laser light sources 11, 12 (i.e., a first set having the laser light sources 11, 12) and (ii) a second set of the laser light sources 13, 14 (i.e., a second set having the laser light sources 13, 14). Here, "set" may be also referred to as a "group".

Each of the first set and the second set is configured to have the same number of laser light sources 10. The laser light sources 10 included in the same set are different types of semiconductor lasers, and can generate laser lights having different wavelengths. Further, the laser light sources 10 forming the first set and the laser light source 10 forming the second set are paired with each other, and the paired laser light sources 10 are made of the same type of semiconductor laser.

Specifically, each of the first laser light source 11 and the third laser light source 13 is made of a first semiconductor laser; each of the second laser light source 12 and the fourth laser light source 14 is made of a second semiconductor laser. The first laser light source 11 and the third laser light source 13 are enabled to switch the laser oscillation at different center wavelengths when the wavelength of the excited level is set to the center wavelength $\lambda 1$ and when the wavelength of the ground level is set to the center wavelength $\lambda 3$. The wavelength of the excited level refers to the peak wavelength of the gain due to the excited level; the wavelength of the ground level refers to the peak wavelength of the gain due to the ground level. Further, it is not always necessary to match the center wavelength and the peak wavelength of the gain. Similarly, the second laser light source 12 and the fourth laser light source 14 are enabled to switch the laser oscillation at different center wavelengths when the wavelength of the excited level is set to the center wavelength $\lambda 2$ and when the wavelength of the ground level is set to the center wavelength $\lambda 4$. The center wavelengths $\lambda 1$ to $\lambda 4$ have a relationship of $\lambda 1 < \lambda 2 < \lambda 3 < \lambda 4$. Therefore, the excited level or the ground level of the second and fourth laser light sources 12 and 14 as one pair of the laser light sources 10 is configured to be sandwiched between the excited level and the ground level of the first and third laser light sources 11 and 13 as another pair of the laser light sources 10.

Figure 2:
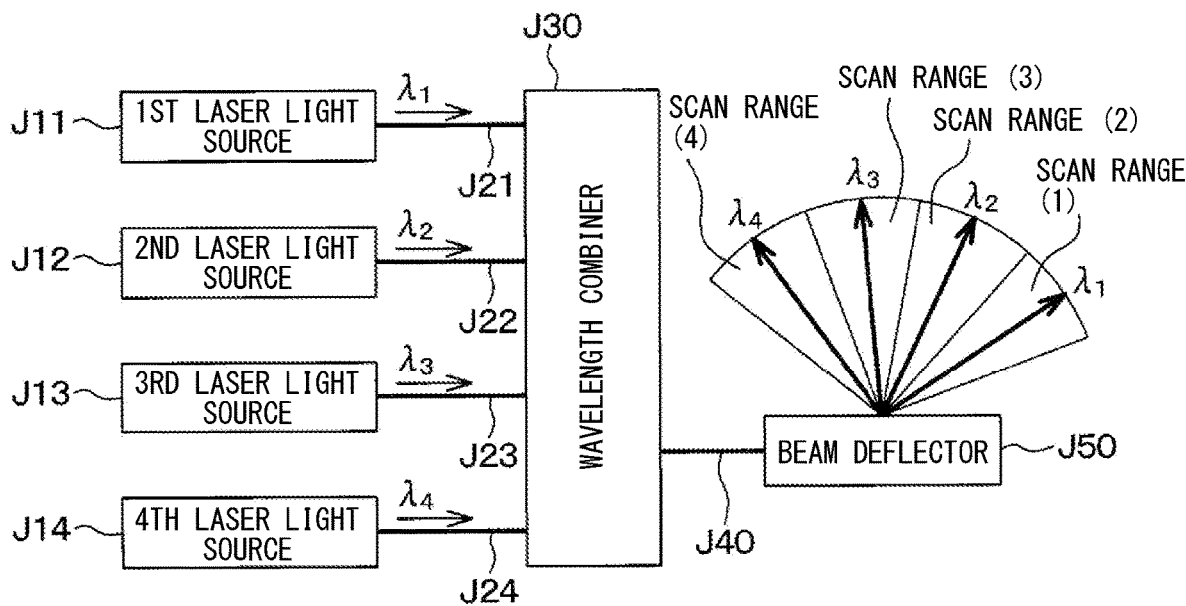
FIG. 2 is a diagram showing a schematic configuration of a known beam deflection system as a comparative example.
Figure 3:
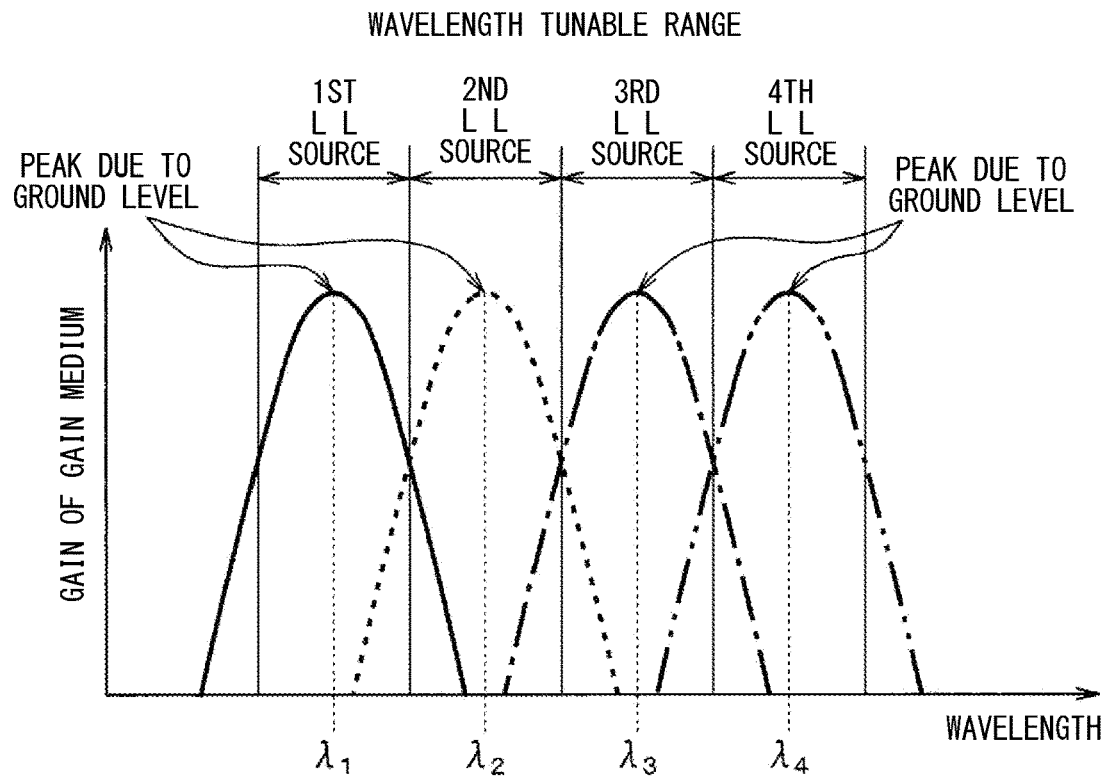
FIG. 3 is a diagram showing a gain of a gain medium and a tunable range of wavelengths with respect to the wavelengths of first to fourth laser light sources provided in the beam deflection system of the comparative example.
Figure 4:
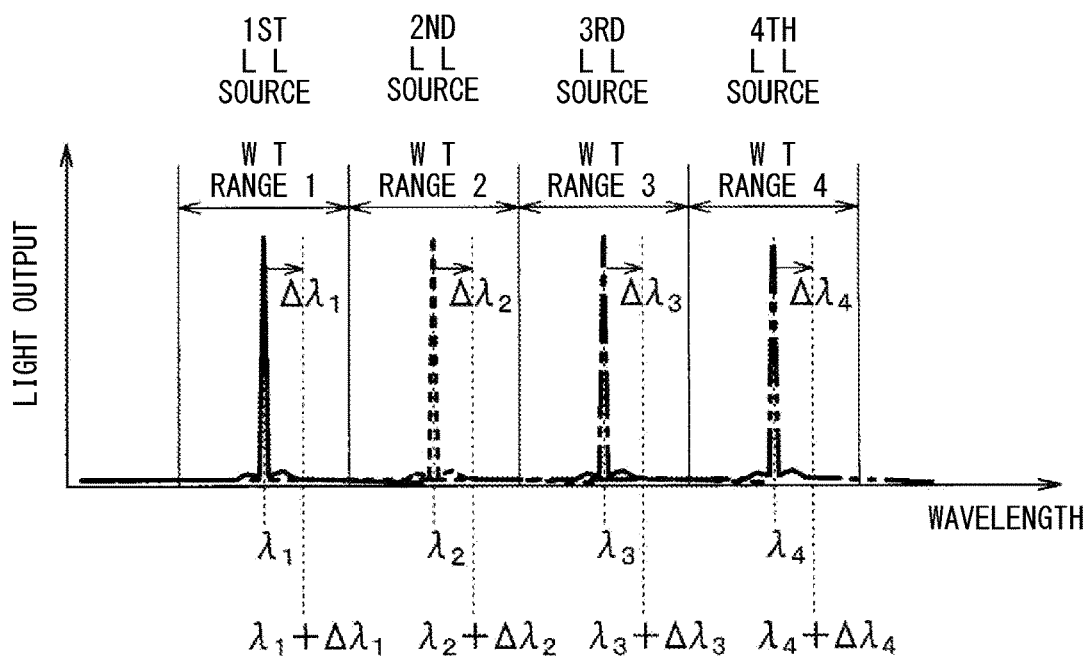
FIG. 4 is a diagram showing an optical output and a tunable range with respect to each of the center wavelengths of first to fourth laser light sources provided in the beam deflection system of the comparative example.

In a known technology, as shown in FIG. 2, first to fourth laser light sources J11 to J14 like in the present embodiment are provided; each laser light source J10 is used as a laser oscillator having a corresponding one of the center wavelengths $\lambda 1$ to $\lambda 4$. Note that a center wavelength is a peak of the gain of the gain medium of each of the first to fourth laser light sources J11 to J14 (i.e., a peak of the gain determined by the material of the laser light source 10 in the state where the laser is not oscillating). Such center wavelengths of the first to fourth laser light sources J11 to J14 are provided to be different from each other, as shown in FIG. 3. In the example shown in FIG. 3, the center wavelength of the first laser light source J11 at the ground level is $\lambda 1$, the center wavelength of the second laser light source J12 at the ground level is $\lambda 2$, the center wavelength of the third laser light source J13 at the ground level is $\lambda 3$, and the fourth laser light source J14 at the ground level is $\lambda 4$. In this case, the wavelength range in which the gain of the gain medium is equal to or higher than a predetermined gain is a wavelength tunable range. The light output when the laser is oscillated is shown as shown in FIG. 4. A desired light output can be obtained by laser oscillation even if the wavelength of each laser light source is changed within a predetermined wavelength tunable range with respect to the center wavelength.

Specifically, as shown in FIG. 2, the laser lights of the center wavelengths $\lambda 1$ to $\lambda 4$ output by the first to fourth laser light sources J11 to J14 are propagated to the wavelength combiner J30 via the first to fourth waveguides J21 to J24 and are combined by the wavelength combiner J30. Then, the light combined by the wavelength combiner J30 is propagated to the beam deflector J50 via the waveguide J40, and emitted as a laser beam through the beam deflector J50. As a result, the laser beams emitted from the laser light sources J11 to J14 can be emitted from the beam deflector J50 with different scanning ranges. Specifically, the laser light emitted by the first laser light source J11 corresponds to a laser beam in the scanning range (1) centered on the wavelength $\lambda 1$. The laser light emitted by the second laser light source J12 corresponds to a laser beam having a scanning range (2) centered on the wavelength $\lambda 2$. The laser light emitted by the third laser light source J13 corresponds to a laser beam having a scanning range (3) centered on the wavelength $\lambda 3$. The laser light emitted by the fourth laser light source J14 is a laser beam having a scanning range (4) centered on the wavelength $\lambda 4$.

Note that $\lambda\lambda 1$ to $\lambda\lambda 4$ shown in FIG. 4 are wavelength shift amounts at the respective laser light sources J11 to J14; the amount shifted from the center wavelengths $\lambda 1$ to $\lambda 4$ within the tunable range is shown. Suppose a case where laser lights with the wavelength shift amounts $\lambda\lambda 1$ to $\lambda\lambda 4$ are emitted, respectively, with respect to the center wavelengths $\lambda 1$ to $\lambda 4$. In such a case, such laser lights are emitted, respectively, at angle shift amounts $\lambda\lambda 1$ to $\lambda\theta 4$ corresponding to the wavelength shift amounts $\lambda\lambda 1$ to $\lambda\lambda 4$. The angle shift amount $\lambda\theta 1$ to $\lambda\theta 4$ are set to values corresponding to the desired scanning ranges when the wavelength shift amounts $\lambda\lambda 1$ to $\lambda\lambda 4$ are from the lower limit value to the upper limit value of the wavelength tunable range. That is, the materials of the laser light sources J11 to J14 are adjusted so that the wavelength tunable ranges of the plurality of laser light sources J11 to J14 are consecutive. As a result, the scanning ranges (1) to (4) become a continuous range. Therefore, as shown in FIG. 5, each of the laser light sources J11 to J14 is assigned to a specific scanning range, and the laser lights are concurrently emitted from the laser light sources J11 to J14. This makes it possible to concurrently scan the scanning ranges (1) to (4) with a plurality of laser beams.

However, in such a configuration, each of the laser light sources J11 to J14 can emit a laser beam only in the corresponding one of the scanning ranges (1) to (4). The ROI cannot be scanned intensively using multiple beams.

Therefore, in the present embodiment, the first to fourth laser light sources 11 to 14 form two sets. Further, one laser light source 10 included in the first set and one laser light source 10 included in the second set are provided to be included in one pair and composed of the same type of semiconductor laser. Further, the laser oscillations of the first to fourth laser light sources 11 to 14 are switched between two different center wavelengths; one of the two different center wavelengths corresponds to the wavelength of the excited level and the other one of the two different center wavelengths corresponds to the wavelength of the ground level.

Figure 6:
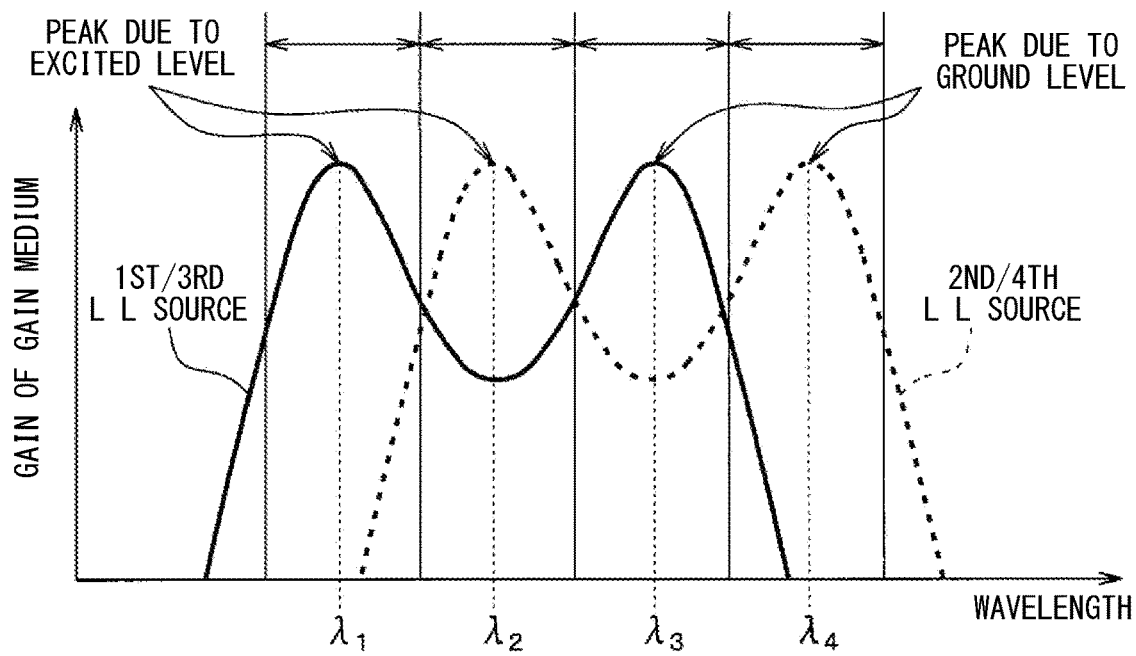
FIG. 6 is a diagram showing a gain of a gain medium and a tunable range of wavelengths with respect to the wavelengths of first to fourth laser light sources provided in the beam deflection system according to the first embodiment.

Specifically, as shown in FIG. 6, the first laser light source 11 and the third laser light source 13 are configured by a first semiconductor laser. The wavelength dependence of the gain of the gain medium of each of the laser light sources 11 and 13 has two maximum values. That is, the gain of the gain medium has peaks at the wavelength of the excited level and the wavelength of the ground level. The wavelength of the excited level is set to the center wavelength $\lambda 1$ of the wavelength tunable range of the first laser light source 11, and the wavelength of the ground level is set to the center wavelength $\lambda 3$ of the wavelength tunable range of the third laser light source 13.

Similarly, the second laser light source 12 and the fourth laser light source 14 are configured by a second semiconductor laser so that the wavelength dependence of the gain of the gain media of each of the laser light sources 12 and 14 has two maximum values. That is, the gain of the gain medium has peaks at the wavelength of the excited level and the wavelength of the ground level. The wavelength of the excited level is set to the center wavelength $\lambda 2$ of the wavelength tunable range of the second laser light source 12; the wavelength of the ground level is set to the center wavelength $\lambda 4$ of the wavelength tunable range of the fourth laser light source 14.

Figure 7:
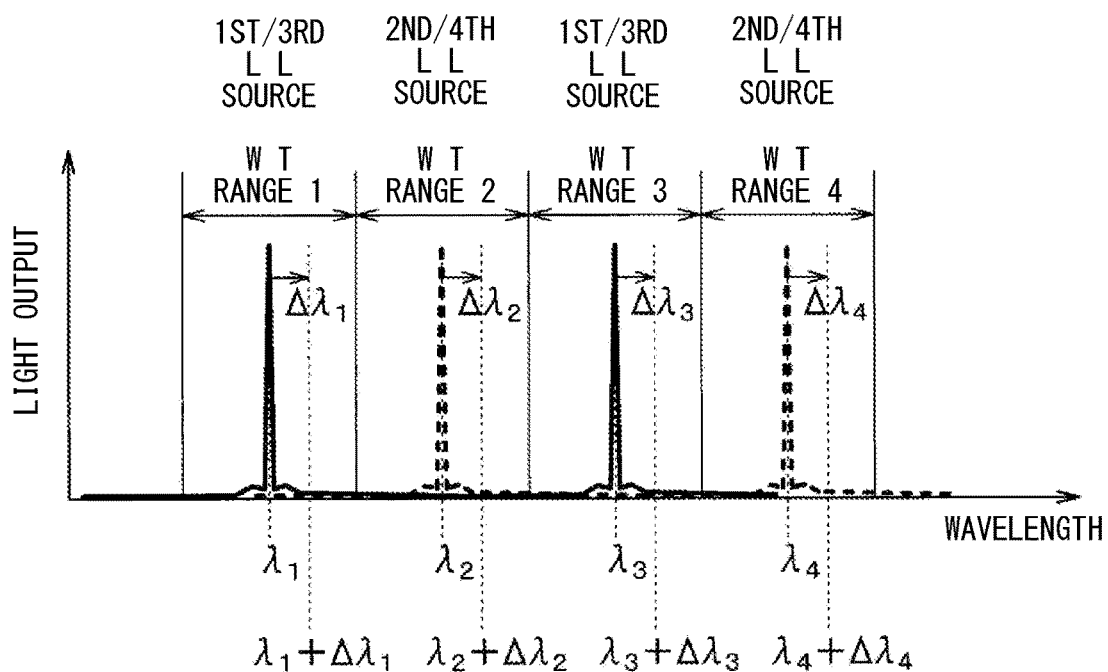
FIG. 7 is a diagram showing an optical output and a tunable range with respect to each of the center wavelengths of first to fourth laser light sources provided in the beam deflection system of the first embodiment.

In these cases, the light output when the laser is oscillated is shown as shown in FIG. 7. A desired light output can be obtained by laser oscillation even if the wavelength is changed within a predetermined wavelength tunable range centered on each center wavelength $\lambda 1$ to $\lambda 4$. Therefore, even if the first laser light source 11 and the third laser light source 13 are configured by the same first semiconductor laser, and the second laser light source 12 and the fourth laser light source 14 are configured by the same second semiconductor laser, it is possible to obtain a desired light output at the center wavelengths $\lambda 1$ to $\lambda 4$.

Therefore, as shown in FIG. 1, the laser lights with the first to fourth laser light sources 11 to 14 are emitted as the center wavelengths $\lambda 1$ to $\lambda 4$; thereby, the laser beams can be emitted concurrently to a plurality of consecutive scanning ranges (1) to (4).

On the other hand, the first embodiment has a configuration where the first laser light source 11 and the third laser light source 13 are composed of the same first semiconductor laser and the second laser light source 12 and the fourth laser light source 14 are composed of the same second semiconductor laser. Such a configuration enables both the first laser light source 11 and the third laser light source 13, or both the second laser light source 12 and the fourth laser light source 14 to emit the laser lights with the same center wavelength. For example, both the first laser light source 11 and the third laser light source 13 are set to emit the laser lights with the center wavelength $\lambda 1$. In this way, it is possible to concentrate the laser beams based on the laser lights emitted from both the first laser light source 11 and the third laser light source 13 in the same scanning range (1).

Similarly, both the first laser light source 11 and the third laser light source 13 are each enabled to emit the light having a center wavelength of $\lambda 3$. Therefore, it is possible to concentrate the laser beams based on the laser lights emitted from both the first laser light source 11 and the third laser light source 13 in the same scanning range (3). Further, both the second laser light source 12 and the fourth laser light source 14 are set to emit the laser lights with the center wavelength $\lambda 2$. Therefore, it is possible to concentrate the laser beams based on the laser lights emitted from both the second laser light source 12 and the fourth laser light source 14 in the same scanning range (2). Further, both the second laser light source 12 and the fourth laser light source 14 are each enabled to emit the light having a center wavelength of $\lambda 4$. Therefore, it is possible to concentrate the laser beams based on the laser lights emitted from both the second laser light source 12 and the fourth laser light source 14 in the same scanning range (4).

Based on this, the desired scanning ranges and the scanning assignments of the first to fourth laser light sources 11 to 14 are summarized in a diagram as shown in FIGS. 8 to 11.

First, during normal scanning, when scanning the scanning ranges (1) to (4) concurrently, the scanning allocation shown in FIG. 8 is provided. Specifically, as shown in FIG. 8, scanning is assigned to each of the first to fourth laser light sources 11 to 14, and laser lights are emitted concurrently with center wavelengths λ1 to λ4. This makes it possible to scan a plurality of scanning ranges (1) to (4) concurrently.

In addition, suppose a case of performing intensive scanning in the scanning range (1) to (2). In such a case, the scanning ranges are assigned as shown in FIG. 9. That is, the scanning range (1) is assigned to the first and third laser light sources 11 and 13. The scanning range (2) is assigned to the second and fourth laser light sources 12 and 14. Then, the first and third laser light sources 11 and 13 are each assigned with the center wavelength λ1. The second and fourth laser light sources 12 and 14 are assigned with the center wavelength λ2. Thereby the laser lights having the different center wavelengths λ1 and λ2 are emitted concurrently. This makes it possible to concentrate the laser beam based on the laser lights emitted from the first to fourth laser light sources 11 to 14 in the scanning ranges (1) and (2).

Similarly, suppose a case of performing intensive scanning in the scanning ranges (3) and (4). In such a case, the scanning ranges are assigned as shown in FIG. 10. That is, the scanning range (3) is assigned to the first and third laser light sources 11 and 13. The scanning range (4) is assigned to the second and fourth laser light sources 12 and 14. Then, the first and third laser light sources 11 and 13 are each assigned with the center wavelength λ3. The second and fourth laser light sources 12 and 14 are assigned with the center wavelength λ4. Thereby the laser lights having the different center wavelengths λ2 and λ4 are emitted concurrently. This makes it possible to concentrate the laser beam based on the laser lights emitted from the first to fourth laser light sources 11 to 14 in the scanning ranges (3) and (4).

Further, intensive scanning can be performed on the scanning ranges (2) and (3). In such a case, the scanning ranges are assigned as shown in FIG. 11. That is, the scanning range (3) is assigned to the first and third laser light sources 11 and 13. The scanning range (2) is assigned to the second and fourth laser light sources 12 and 14. Then, the first and third laser light sources 11 and 13 are each assigned with the center wavelength λ3. The second and fourth laser light sources 12 and 14 are assigned with the center wavelength λ2. Thereby the laser lights having the different center wavelengths λ3 and λ2 are emitted concurrently. This makes it possible to concentrate the laser beam based on the laser lights emitted from the first to fourth laser light sources 11 to 14 in the scanning ranges (2) and (3).

As described above, in the beam deflection system of the present embodiment, the first to fourth laser light sources 11 to 14 form two sets. Each one of the laser light sources 10 forming the first set and a corresponding one of the laser light sources 10 forming the second set are made of the same type of semiconductor laser. (i) Each one of the laser light sources 10 forming the first set and (ii) the corresponding one of the laser light sources 10 forming the second set are thus paired with each other. Then, the laser oscillations of the first to fourth laser light sources 11 to 14 are enabled to switch between two different center wavelengths. One of the two different center wavelengths corresponds to the wavelength of the excited level; other one of the two different center wavelengths corresponds to the wavelength of the ground level.

As a result, during normal scanning, the laser beams are emitted from the first to fourth laser light sources 11 to 14 with the center wavelengths λ1 to λ4, respectively, so that the laser beams can be radiated concurrently to a plurality of consecutive scanning ranges (1) to (4). In addition, suppose a case where beam control is performed to concentrate the laser beams on a specific scanning range. In such a case, the first and third laser light sources 11 and 13 are laser-oscillated at the same center wavelength, and the second and fourth laser light sources 12 and 14 are laser-oscillated at the same center wavelength. As a result, even if only four laser light sources 10 of the first to fourth laser light sources 11 to 14 are provided, it is possible to concurrently irradiate the same scanning range with the laser beams using a plurality of the laser light sources 10.

Therefore, in a beam deflection system in which a plurality of laser light sources 10 cover a wide scanning range, it is possible to realize beam control that concentrates the laser beams in a specific scanning range while limiting the number of laser light sources 10.

Second Embodiment

A second embodiment will be described. The present embodiment is the same as the first embodiment except that the number of laser light sources 10 is changed from that in the first embodiment, and therefore, portions different from the first embodiment will be mainly described.

Figure 12:
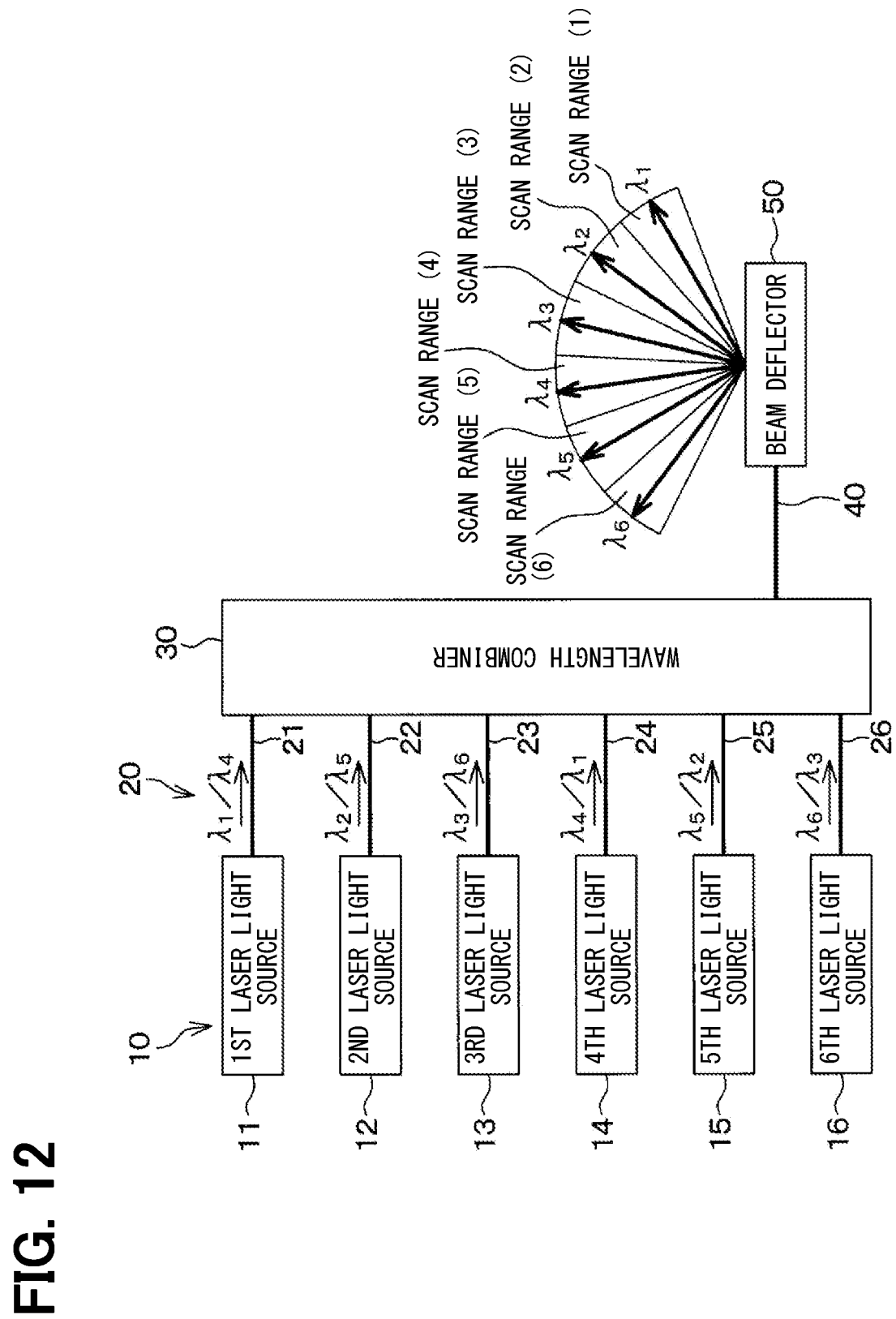
FIG. 12 is a diagram showing a schematic configuration of a beam deflection system according to a second embodiment.

As shown in FIG. 12, the beam deflection system of the present embodiment includes first to sixth laser light sources 11 to 16 as the laser light sources 10. Further, the waveguides 20 also include first to sixth waveguides 21 to 26 connecting the first to sixth laser light sources 11 to 16 and the wavelength combiner 30.

In such a configuration, the wavelength combiner 30 combines the laser lights from the first to sixth laser light sources 11 to 16 propagated through the waveguides 20 to combine the laser lights to produce a combined laser light. The combined laser light is output to the waveguide 40 and then transmitted to the beam deflector 50. As a result, the laser beam can be concurrently emitted from the beam deflector 50 to a plurality of scanning ranges.

More specifically, in the present embodiment, the laser light sources 10 forms or are divided into two sets of a first set and a second set. The first set is a set of or including the first to third laser light sources 11 to 13. The second set is a set of or including the fourth to sixth laser light sources 14 to 16. Each one of the laser light sources 10 forming the first set and a corresponding one of the laser light sources 10 forming the second set are made of the same type of semiconductor laser. (i) Each one of the laser light sources 10 forming the first set and (ii) the corresponding one of the laser light sources 10 forming the second set are thus paired with each other. Specifically, the first laser light source 11 and the fourth laser light source 14 are each made of a first semiconductor laser. The second laser light source 12 and the fifth laser light source 15 are each made of a second semiconductor laser. Further, the third laser light source 13 and the sixth laser light source 16 are each made of a third semiconductor laser. That is, also in this embodiment, the first set and the second set are configured to have the same number of laser light sources 10. The laser light sources 10 included in the same set are provided as different types of semiconductor lasers, and can generate laser lights having different wavelengths.

Figure 13:
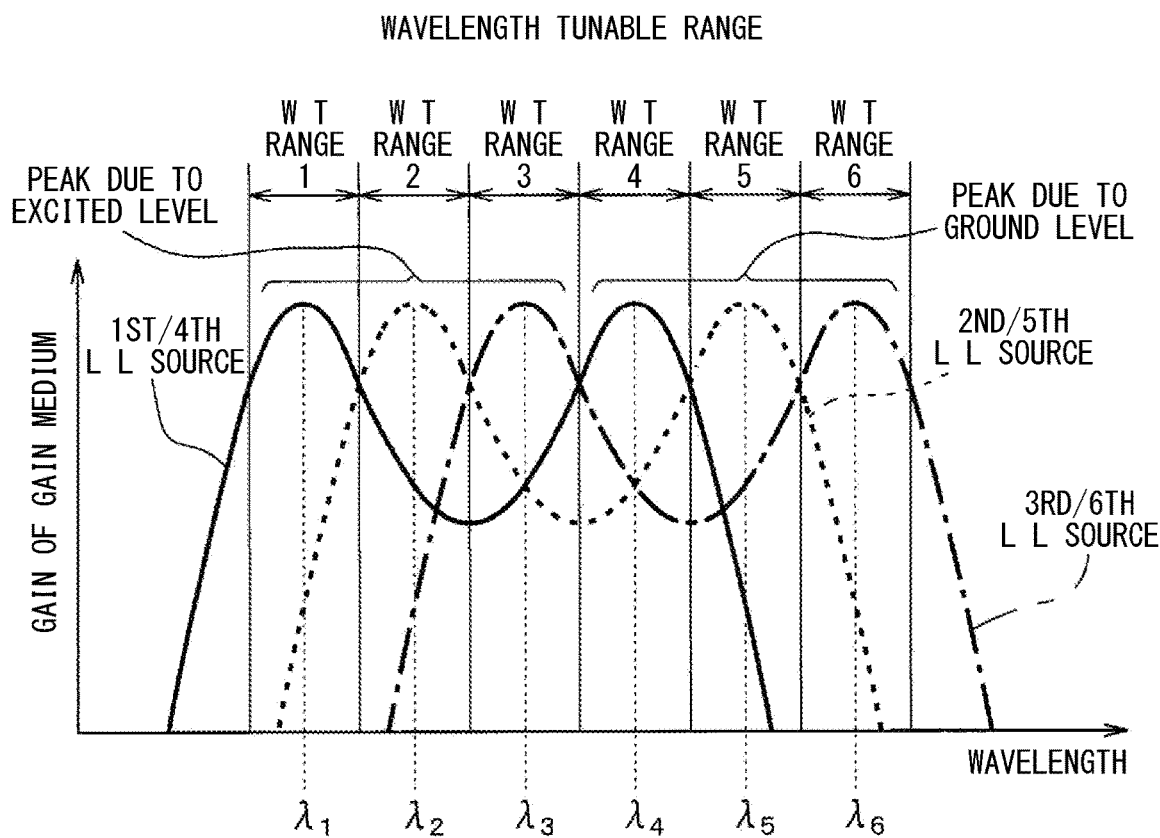
FIG. 13 is a diagram showing a gain of a gain medium and a tunable range of wavelengths with respect to the wavelengths of first to sixth laser light sources provided in the beam deflection system according to the second embodiment.

Then, as shown in FIG. 13, the first laser light source 11 and the fourth laser light source 14 are configured by the same first semiconductor laser. The wavelength dependence of the gain of the gain medium of each of the laser light sources 11 and 14 has two maximum values. That is, the gain of the gain medium has two peaks of (i) a first peak at the wavelength of the excited level and (ii) a second peak at the wavelength of the ground level. Then, during normal scanning, the wavelength of the excited level is set to the center wavelength λ1 of the wavelength tunable range of the first laser light source 11, and the wavelength of the ground level is set to the center wavelength λ4 of the wavelength tunable range of the fourth laser light source 14. Further, during normal scanning, the laser oscillations at different center wavelengths are switchable. That is, in the first laser light source 11 and the fourth laser light source 14, there is a first case where the wavelength of the excited level is set to the center wavelength λ1; there is a second case where the wavelength of the ground level is set to the center wavelength λ4. The laser oscillations at different center wavelengths λ1 and λ4 are thus enabled to switch each.

Similarly, the second laser light source 12 and the fifth laser light source 15 are configured by the same second semiconductor laser. The wavelength dependence of the gain of the gain medium of each of the laser light sources 12 and 15 has two maximum values. That is, the gain of the gain medium has two peaks of (i) a first peak at the wavelength of the excited level and (ii) a second peak at the wavelength of the ground level. Then, during normal scanning, the wavelength of the excited level is set to the center wavelength λ2 of the wavelength tunable range of the second laser light source 12, and the wavelength of the ground level is set to the center wavelength λ5 of the wavelength tunable range of the fifth laser light source 15. Further, during normal scanning, the laser oscillations at different center wavelengths are switchable. That is, in the second laser light source 12 and the fifth laser light source 15, there is a first case where the wavelength of the excited level is set to the center wavelength λ2; there is a second case where the wavelength of the ground level is set to the center wavelength λ5. The laser oscillations at different center wavelengths λ2 and λ5 are thus enabled to switch each.

Similarly, the third laser light source 13 and the sixth laser light source 16 are configured by the same third semiconductor laser. The wavelength dependence of the gain of the gain medium of each of the laser light sources 13 and 16 has two maximum values. That is, the gain of the gain medium has two peaks of (i) a first peak at the wavelength of the excited level and (ii) a second peak at the wavelength of the ground level. Then, during normal scanning, the wavelength of the excited level is set to the center wavelength λ3 of the wavelength tunable range of the third laser light source 13, and the wavelength of the ground level is set to the center wavelength λ6 of the wavelength tunable range of the sixth laser light source 16. Further, during normal scanning, the laser oscillations at different center wavelengths are switchable. That is, in the third laser light source 13 and the sixth laser light source 16, there is a first case where the wavelength of the excited level is set to the center wavelength λ3; there is a second case where the wavelength of the ground level is set to the center wavelength λ6. The laser oscillations at different center wavelengths λ3 and λ6 are thus enabled to switch each.

The center wavelengths λ1 to λ6 have a relationship of λ1<λ2<λ3<λ4<λ5<λ6. Therefore, the excited level and the ground level of the laser light sources 10 of one pair sandwich the excited level or the ground level of each of the remaining two pairs of laser light sources 10. More specifically, as shown in FIG. 13, between the excited level and the ground level of the first and fourth laser light sources 11 and 14, the excited levels of the remaining two pairs of the second and fifth laser light sources 12 and 15 and the third and sixth laser light sources 13 and 16 are sandwiched. Between the excited level and the ground level of the second and fifth laser light sources 12 and 15, the excited level and the ground level of the remaining two pairs of the third and sixth laser light sources 13 and 16 and the first and fourth laser light sources 11 and 14 are sandwiched. Between the excited level and the ground level of the third and sixth laser light sources 13 and 16, the ground levels of the remaining two pairs of the first and fourth laser light sources 11 and 14 and the second and fifth laser light sources 12 and 15 are sandwiched.

Figure 14:
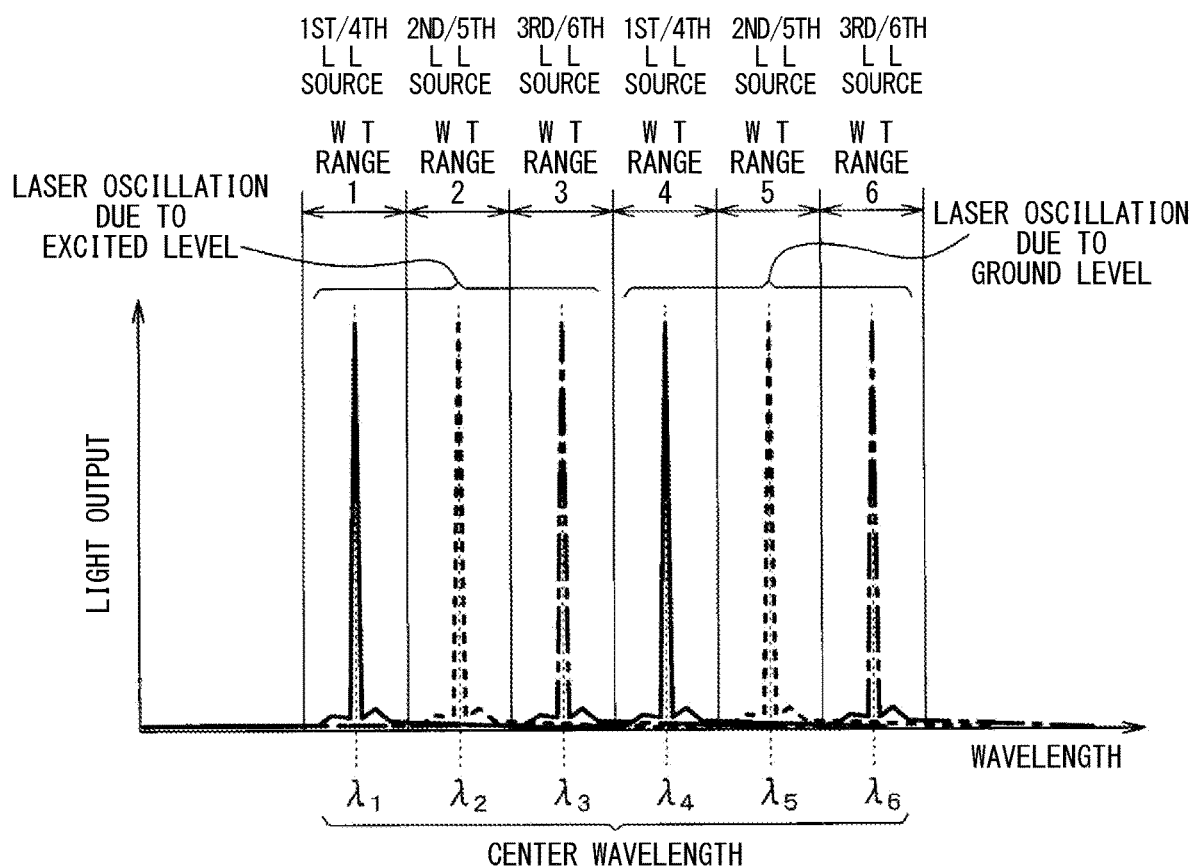
FIG. 14 is a diagram showing an optical output and a tunable range with respect to the center wavelength of the first to sixth laser light sources provided in the beam deflection system according to the second embodiment.

In these cases, the light output when the laser is oscillated is shown as shown in FIG. 14. A desired light output can be obtained by laser oscillation even if the wavelength is changed within a predetermined wavelength tunable range centered on each center wavelength λ1 to λ6. Here, (i) the first laser light source 11 and the fourth laser light source 14, (ii) the second laser light source 12 and the fifth laser light source 15, and (iii) the third laser light source 13 and the sixth laser light source 16 are provided to be configured by the same respective semiconductor lasers. Even in such configurations, the desired light output can be obtained at the center wavelengths λ1 to λ6.

Therefore, as shown in FIG. 12, by emitting laser lights with the first to sixth laser light sources 11 to 16 as the center wavelengths λ1 to λ6, the laser beams can be concurrently radiated to a plurality of consecutive scanning ranges (1) to (6). Therefore, a plurality of consecutive scanning ranges (1) to (6) can be scanned concurrently.

Further, the first laser light source 11 and the fourth laser light source 14 as a pair of laser light sources are provided to be each configured by the same first semiconductor laser. The second laser light source 12 and the fifth laser light source 15 as a pair of laser light sources are provided to be each configured by the same second semiconductor laser. The third laser light source 13 and the sixth laser light source 16 as a pair of laser light sources are provided to be each configured by the same third semiconductor laser. Therefore, the two laser light sources included in each pair are each enabled to emit the laser light having the same center wavelength. For example, both the first laser light source 11 and the fourth laser light source 14 are each enabled to emit the light having a center wavelength of λ4. In this way, the laser beam based on the laser lights emitted from both the first laser light source 11 and the fourth laser light source 14 can be concentrated in the scanning range (1).

Based on this, the desired scanning range and the scanning assignments of the first to sixth laser light sources 11 to 16 are summarized in the diagrams as shown in FIGS. 15 to 19.

First, during normal scanning, when scanning the scanning ranges (1) to (6) concurrently, the scanning allocation shown in FIG. 15 is provided. Specifically, as shown in FIG. 15, scanning is assigned to each of the first to sixth laser light sources 11 to 16, and laser light is emitted concurrently with center wavelengths λ1 to λ6. This makes it possible to scan a plurality of scanning ranges (1) to (6) concurrently.

In addition, suppose a case of performing intensive scanning in the scanning range (1) to (3). In such a case, the scanning ranges are assigned as shown in FIG. 16. That is, the scanning range (1) is assigned to the first and fourth laser light sources 11 and 14. The scanning range (2) is assigned to the second and fifth laser light sources 12 and 15. Further, the scanning range (3) is assigned to the third and sixth laser light sources 13 and 16. Then, the first and fourth laser light sources 11 and 14 are each assigned with the center wavelength λ1. The second and fifth laser light sources 12 and 15 are assigned with the center wavelength λ2. The third and sixth laser light sources 13 and 16 are assigned with the center wavelength λ3. Thereby the laser lights having the different center wavelengths λ1, λ2, and λ3 are emitted concurrently. This makes it possible to concentrate the laser beam based on the laser lights emitted from the first to sixth laser light sources 11 to 16 in the scanning ranges (1) to (3).

The same applies to the case where intensive scanning is performed in the scanning ranges (4) to (6), and the allocation is shown in FIG. 17. That is, the first and fourth laser light sources 11 and 14 are each assigned with the center wavelength λ4. The second and fifth laser light sources 12 and 15 are assigned with the center wavelength λ5. The third and sixth laser light sources 13 and 16 are assigned with the center wavelength λ6. Thereby the laser lights having the different center wavelengths λ4, λ5, and λ6 are emitted concurrently. This makes it possible to concentrate the laser beam based on the laser lights emitted from the first to sixth laser light sources 11 to 16 in the scanning ranges (4) to (6).

The same applies to the case where intensive scanning is performed in the scanning ranges (2) to (4), and the allocation is shown in FIG. 18. That is, the first and fourth laser light sources 11 and 14 are each assigned with the center wavelength λ4. The second and fifth laser light sources 12 and 15 are assigned with the center wavelength λ2. The third and sixth laser light sources 13 and 16 are assigned with the center wavelength λ3. Thereby the laser lights having the different center wavelengths λ4, λ2, and λ3 are emitted concurrently. This makes it possible to concentrate the laser beam based on the laser lights emitted from the first to sixth laser light sources 11 to 16 in the scanning ranges (2) to (4).

The same applies to the case where intensive scanning is performed in the scanning ranges (3) to (5), and the allocation is shown in FIG. 19. That is, the first and fourth laser light sources 11 and 14 are each assigned with the center wavelength λ4. The second and fifth laser light sources 12 and 15 are assigned with the center wavelength λ5. The third and sixth laser light sources 13 and 16 are assigned with the center wavelength λ3. Thereby the laser lights having the different center wavelengths λ4, λ5, and λ3 are emitted concurrently. This makes it possible to concentrate the laser beam based on the laser lights emitted from the first to sixth laser light sources 11 to 16 in the scanning ranges (3) to (5).

As described above, even when the six laser light sources 10 are used, the same effect as that of the first embodiment can be obtained.

Third Embodiment

A third embodiment will be described. The present embodiment will describe a case of using an external resonance laser provided with a wavelength tunable mechanism, as a specific example of the laser light sources 10 described in the first and second embodiments.

Figure 20:
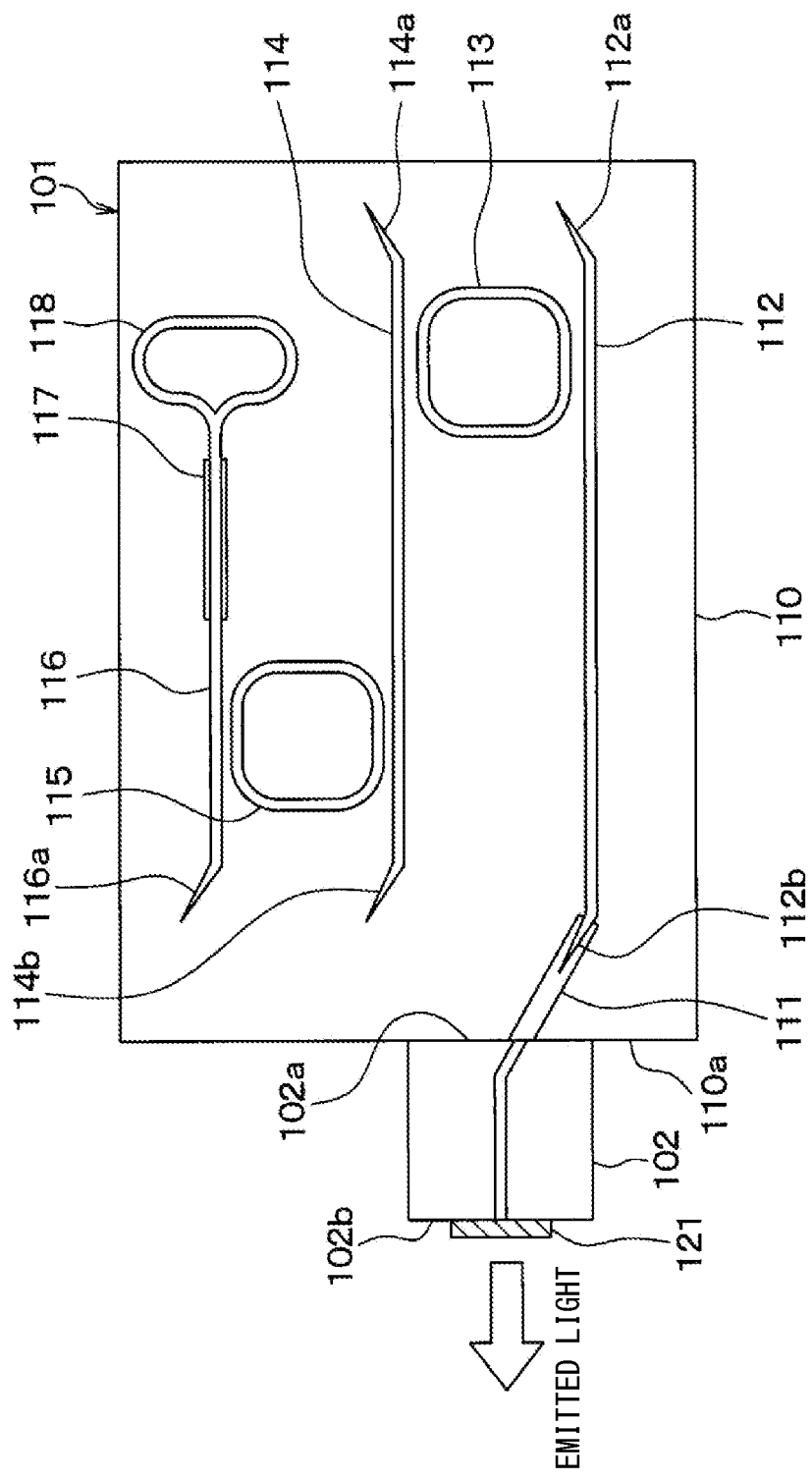
FIG. 20 is a diagram showing a schematic configuration of one laser light source configured by an external laser resonator according to a third embodiment.

FIG. 20 shows a schematic configuration of a single (one) laser light source 10 configured by an external laser resonator. The beam deflection system is configured by including a plurality of laser light sources 10 (i.e., four in the first embodiment, and six in the second embodiment).

As illustrated in FIG. 20, the laser light source 10 includes an optical filter 101 and an SOA 102 (Semiconductor Optical Amplifier 102). In this laser light source 10, the light is emitted from the SOA 102 to the optical filter 101, and is taken out as strong light in a resonance state in the optical filter 101 and the SOA 102. The light is then output from the SOA 102 to the outside as emitted light. The emitted light output from the SOA 102 to the outside corresponds to the laser light of the laser light source 10.

The optical filter 101 is formed, for example, by performing a semiconductor process using a semiconductor substrate 110. The optical filter 101 is provided for each laser light source 10. The optical filters 101 may be formed to be separate from each other; alternatively, a plurality of the optical filters may be integrally formed on the same semiconductor substrate 110. Specifically, the semiconductor substrate 110 constituting the optical filter 101 includes an SSC 111 (Spot Size Converter 111), a first waveguide 112, a first ring resonator 113, a second waveguide 114, a second ring resonator 115, and a third waveguide 116, a modulator 117, and a loop mirror 118.

The SSC 111 is an optical spot size converter. The SSC 111 is for matching the mode diameters of the SOA 102 and the first waveguide 112. One end of the SSC 111 is exposed from the end surface 110a of the semiconductor substrate 110, and the other end is connected to the first waveguide 112. For example, the SSC 111 is formed in a tapered shape, and the mode diameter thereof is gradually expanded from the first waveguide 112 toward the SOA 102. Further, the other end of the SSC 111 connected to the first waveguide 112 is inclined by a predetermined angle with respect to the longitudinal direction of the first waveguide 112.

The first waveguide 112, the second waveguide 114, and the third waveguide 116 serve as an optical waveguide that propagates the light from the SOA 102 transmitted from the SSC 111. The first waveguide 112, the second waveguide 114, and the third waveguide 116 are formed as respective lines in their longitudinal directions, and are arranged parallel to each other. Of the first waveguide 112, the second waveguide 114, and the third waveguide 116, the inner portions other than the tip portion have the same width and thickness, and constant cross-sectional area. The first waveguide 112 propagates the light to the first ring resonator 113 and the light returned from the first ring resonator 113 to the SOA 102. The second waveguide 114 propagates the light propagated from the first ring resonator 113 to the second ring resonator 115, and propagates the light returned from the second ring resonator 115 to the first ring resonator 113. Since the light propagated from the second ring resonator 115 is returned through the loop mirror 118 in the third waveguide 116, it propagates to the second ring resonator 115 again.

A terminator 112a is disposed on one end of the first waveguide 112, the one end being opposite to the SSC 111. Terminators 114a, 114b are disposed on both ends of the second waveguide 114. A terminator 116a is disposed on one end of the third waveguide 116, the one end being opposite to the loop mirror 118. Unnecessary lights transmitted through the waveguides are emitted to the outside of the waveguides by the terminators 112a, 114a, 114b, 116a. Each of the terminators 112a, 114a, 114b, 116a extends in a direction inclined by a predetermined angle with respect to the longitudinal direction of the corresponding waveguide and has a tapered shape so as to prevent unnecessary light from being reflected and transmitted to the waveguide again.

Further, one end of the first waveguide 112, the one end being connected to the SSC 111, also extends in a direction inclined by a predetermined angle with respect to the longitudinal direction of the first waveguide 112. Since the one end is connected to the SSC 111 including a waveguide 112b having a tapered shape, the light is efficiently transmitted toward the SSC 111 by reducing reflection.

Each of the first ring resonator 113 and the second ring resonator 115 is a resonator that generates a transmission spectrum having a predetermined FSR (Free Spectral Range) by input of the light thereto.

At a wavelength where the transmission spectrums generated by the first ring resonator 113 and the second ring resonator 115 overlap, a transmission spectrum of a double ring corresponding to a synthetic spectrum thereof has the highest first peak. A longitudinal mode of a Fabry-Perot resonator formed between a reflecting mirror 121 and the loop mirror 118 is selected based on the first peak, and strong light is obtained due to laser oscillation. Thus, the strong light is output as an emitted light from the SOA 102 to the outside.

The first ring resonator 113 is disposed between the first waveguide 112 and the second waveguide 114 at a position separated from the first waveguide 112 and the second waveguide 114 by a predetermined gap or distance, but optically coupled to the first waveguide 112 and the second waveguide 114. Thus, when the light is transmitted from the first waveguide 112, the light is transmitted to the first ring resonator 113, and the light transmitted into the first ring resonator 113 is transmitted to the second waveguide 114.

Further, the second ring resonator 115 is disposed between the second waveguide 114 and the third waveguide 116 at a position separated from the second waveguide 114 and the third waveguide 116 by a predetermined gap or distance, but optically coupled to the second waveguide 114 and the third waveguide 116. Thus, when the light is transmitted from the second waveguide 114, the light is transmitted to the second ring resonator 115, and the light transmitted into the second ring resonator 115 is transmitted to the third waveguide 116.

Figure 21:
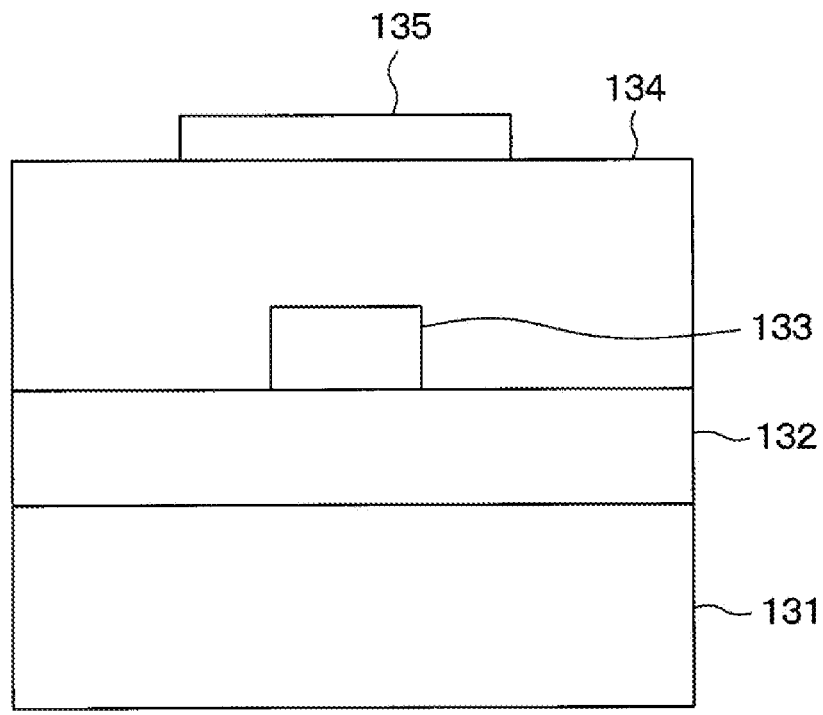
FIG. 21 is a diagram showing a cross-sectional structure of a first ring resonator according to the third embodiment.

Each of the first ring resonator 113 and the second ring resonator 115 is provided with a heater 135 (described later) as illustrated in FIG. 21. Each of the first ring resonator 113 and the second ring resonator 115 is capable of intentionally changing the FSR of the transmission spectrum by being heated by the heater 135.

The widths of the first waveguide 112, the second waveguide 114, and the third waveguide 116 are all set to be the same. Further, the first ring resonator 113 and the second ring resonator 115 are configured by having four rectangular corners as quadrants, and the width is the same as the width of the waveguides 112, 114, and 116. The linear portions of the first ring resonator 113 facing the first waveguide 112 and the second waveguide 114 and the linear portions of the second ring resonator 115 facing the second waveguide 114 and the third waveguide 116 are optically coupled and their lengths are set in consideration of the coupling efficiency. Further, the gap between the waveguides, which is the distance between the first ring resonator 113 and the first waveguide 112 or the second waveguide 114, is also set in consideration of the coupling efficiency.

FIG. 21 shows the cross-sectional structure of the first ring resonator 113. Further, the first ring resonator 113 includes a support substrate 131, an under-clad layer 132, a core layer 133, an over-clad layer 134, and the heater 135, which are stacked together.

The support substrate 131 is made of a silicon substrate or the like. The under-clad layer 132 is formed of an insulating film such as a silicon oxide film (SiO2), and is formed on the support substrate 131. The core layer 133 is a part constituting a waveguide of the first ring resonator 113, and includes silicon or the like. The core layer 133 is patterned so that its upper face shape has the shape of the first ring resonator 113. The width of the core layer 133 corresponds to the width of the first ring resonator 113. The over-clad layer 134 is formed of an insulating film such as SiO2 and is formed so as to cover the core layer 133. The heater 135 is formed on the over-clad layer 134 at a position corresponding to the core layer 133. The heater 135 is made of a heat generating material that can heat the core layer 133 by energization, such as Ta, TiN, and TaN.

Although the sectional structure of the first ring resonator 113 has been described above, the second ring resonator 115 also has a similar structure. Further, the first to third waveguides 112, 114, 116 basically have the sectional configuration illustrated in FIG. 21 from which the heater 135 is eliminated. Further, a silicon on insulator (SOI) substrate is used as the support substrate 131, the under-clad layer 132, and the core layer 133; the core layer 133 is formed by patterning an active layer in the SOI substrate.

The modulator 117 modulates the phase of the light passing through the third waveguide 116. For example, a phase modulator using a thermo-optic effect, a carrier plasma effect, or an electro-optic effect is used as the modulator 117. The modulator 117 may be disposed not on the third waveguide 116, but on the first waveguide 112 or the second waveguide 114.

The loop mirror 118 plays a role of propagating the light propagated from the third waveguide 116 in a loop shape and propagating the light again to the third waveguide 116.

On the other hand, the SOA 102 includes, for example, a III-V compound semiconductor structure and serves as a light source that amplifies and outputs light. The SOA 102 is connected to and integrated with the optical filter 101 by sticking one face 102a to the end face 110a of the semiconductor substrate 110. The SOA 102 is connected to the end face 110a on the one face 102a through a matching oil or an ultraviolet curable resin (not illustrated) so as to be optically coupled to the first waveguide 112.

The other surface 102b of the SOA 102 is a surface that serves as a light emitting surface. The other surface 102b is provided with a reflecting mirror 121, which plays a role of reflecting light inside and returning it to the optical filter 101 while taking out or extracting light from the SOA 102 to the outside. When the light is taken out to the outside while being reflected by the reflecting mirror 121 as in the present embodiment, the reflectance of the reflecting mirror 121 is generally about 1 to 10%.

Figure 22:
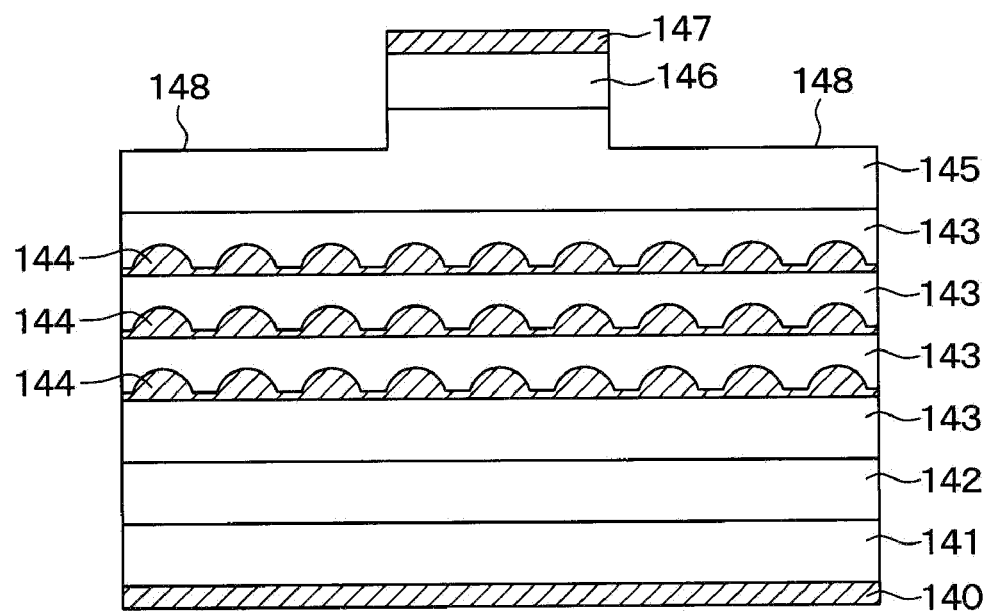
FIG. 22 is a diagram showing a cross-sectional structure of SOA according to the third embodiment.

FIG. 22 shows the cross-sectional structure of the SOA 102. The SOA 102 is composed of a laminated structure of a lower electrode 140, a substrate 141, an under-clad layer 142, an intermediate layer 143, a quantum dot layer 144, an over-clad layer 145, a contact layer 146, and an upper electrode 147.

The lower electrode 140 is brought into contact with the back surface side of the substrate 141, that is, the side opposite to the under-clad layer 142. The substrate 141 is made of, for example, a GaAs substrate. The under-clad layer 142 is made of n-type AlGaAs or the like. The intermediate layer 143 and the quantum dot layer 144 are alternately formed. Here, the intermediate layer 143 and the quantum dot layer 144 are alternately and repeatedly formed, for example, a structure in which three stacks are repeatedly laminated. The intermediate layer 143 is composed of, for example, InxGa1-xAs (0≤x<1), and the quantum dot layer 144 is composed of, for example, InAs and InGaAs. The quantum dot layer 144 has a structure including granular quantum dots formed by crystal growth, microfabrication, or the like, and the front surface side and the back surface side are covered with the intermediate layer 143.

The over-clad layer 145 is formed on the surface of the intermediate layer 143 located at the uppermost layer, and is made of, for example, AlGaAs. The contact layer 146 is formed on AlGaAs, for example, made of GaAs, and is formed to make contact with the upper electrode 147. The upper electrode 147 is formed so as to be in contact with the surface of the contact layer 146. A recess 148 is formed up to the surface layer of the upper electrode 147, the contact layer 146, and the over-clad layer 145; the upper electrode 147 and the contact layer 146 are projected at positions other than the recess 148 to form a mesa structure.

With the SOA 102 configured in this way, laser oscillation can be generated and laser light can be emitted by applying a voltage that generates a predetermined potential difference between the upper electrode 147 and the lower electrode 140.

In this manner, the laser light source is configured by combining the optical filter 101 and the SOA 102. In such a laser light source, (i) a Fabry-Perot resonator in which light is reflected by the reflecting mirror 121 and the loop mirror 118 is formed, and (ii) a resonance state having the longitudinal modes between the reflecting mirror 121 and the loop mirror 118 is produced. Then, due to a strong resonant state of the first ring resonator 113 and the second ring resonator 115, one or more of the longitudinal modes are selected, laser oscillation occurs at a wavelength where the strong resonant state is generated, and strong light is induced and emitted from the reflecting mirror 121 and output as the emitted light.

Then, the laser is adjusted by adjusting the laser resonator length of the external laser resonator constituting the laser light source 10 by adjusting the temperature of the heater 135 provided in the first ring resonator 113 and the second ring resonator 115. The wavelength of light can thus be made tunable.

Further, the wavelength of the laser light can be made tunable based on the control of the ground level and the excited level of the gain medium in the laser light source 10. For example, the ground level and the excited level may be controlled by at least one of four adjustments. Four adjustments are (i) adjusting the size of the quantum dots constituting the quantum dot layer 144, (ii) adjusting the composition of the intermediate layer 143, (iii) adjusting the composition of the underclad layer 142, and (iv) adjusting the element temperature of the SOA 102.

Both the adjustment of the laser resonator length and the control of the ground level and excited level may be performed, but at least one of them may be used. In particular, when the wavelength dependence of the gain of the gain medium is broad, it is not always necessary to control the ground level and the excited level.

For example, when six laser light sources 10 are used as in the second embodiment, as shown in FIG. 23, the center wavelengths λ1 to λ6 of the first to sixth laser light sources 11 to 16 can be set from 1215 to 1365 nm with intervals of 30 nm, individually. Further, the lower limit of tunable wavelength can be set to −15 nm and the upper limit of tunable wavelength can be set to +15 nm for each center wavelength λ1 to λ6. This enables the wavelength tunable range of the first to sixth laser light sources 11 to 16 to be continuous.

Note that FIG. 23 shows an example of using six laser light sources 10 as in the second embodiment, but the same applies to the case where four laser light sources 10 are used as in the first embodiment. In that case, for example, the four center wavelengths λ1 to λ4 may be selected from the top of the six shown in FIG. 23, or the other four consecutive center wavelengths may be selected.

Other Embodiments

Although the present disclosure is made with reference to the embodiments described above, the present disclosure is not limited to such embodiments but may include various changes and modifications which are within equivalent ranges. In addition, various combinations and forms, and further, other combinations and forms including only one element, or more or less than these elements are also within the scope and the scope of the present disclosure.

For example, the case where four laser light sources 10 are provided in the first embodiment and six laser light sources 10 are provided in the second embodiment has been described as an example, but the present disclosure is not limited to these.

Now the following definitions are introduced: (i) M is defined as a positive integer more than one; (ii) N is a positive integer satisfying an expression of "1≤N≤M"; and (iii) the center wavelengths are each defined as A. Thereby, the first embodiment and the second embodiment can be summarized as follows. That is, by providing two sets of M types of laser light sources 10 capable of switching to two different center wavelengths, a total of 2M laser light sources 10 are provided. The two sets are a first set of M types of laser light sources and a second set of M types of laser light sources. Further, the center wavelengths of the Nth laser light source 10 of each of the two sets of M laser light sources 10 are defined as λN and λM+N.

Herein, an expression of "λ1< . . . <λN< . . . <λM<λM+1< . . . <λM+N< . . . <λ2M" (i.e., "λ1≤λN≤λM<λM+1≤λM+N≤λ2M") is satisfied. In other words, i is defined as a positive integer satisfying an expression of 1≤i≤2M, the λi including the λN and the λM+N. Under this definition, the 2M center wavelengths have a relationship in which a respective center wavelength (λi) is provided to become longer as the i is increased from 1 to 2M.

In this way, the laser light emitted from the plurality of laser light sources 10 can be combined by the wavelength combiner 30 and emitted from the beam deflector 50 as a laser beam having a scanning range according to the wavelength. In addition, beam control that concentrates the laser beam on a specific scanning range can be realized.

Further, in the above embodiments, the optical filters 101 in the plurality of laser light sources 10 are described. Those optical filters 101 may be configured separately from each other or integrated with each other. Further, the waveguide 20, the wavelength combiner 30, the waveguide 40 and the beam deflector 50 can be integrally formed.

For reference to further explain features of the present disclosure, the description is added as follows.

There is proposed an optical deflection device as a beam deflection system. This light deflection device is configured to be capable of concurrently scanning a plurality of scanning ranges using a plurality of tunable laser light sources. Due to the limitation of the wavelength tunable range of the tunable laser light source, it is not possible to cover a wide scanning range with one laser beam. Therefore, in this light deflection device, the entire scanning range is shared by providing a plurality of laser light sources. Specifically, laser beams output from a plurality of laser light sources having different wavelengths are introduced into a beam polarizer to form an emitter that emits light at an emission angle corresponding to each wavelength. As a result, a plurality of scanning ranges can be scanned concurrently.

Suppose cases where in scanning multiple scanning ranges concurrently using multiple laser light sources, the scanning range can be narrowed down to ROI (Region Of Interest) and the ROI can be scanned intensively using multiple beams. If such cases are possible, ROIs can be scanned with higher than normal angular resolution, i.e. density.

However, the wavelength range that each laser light source can handle is limited. Therefore, when it is desired to concentrate the laser beam on a specific scanning range, such beam control cannot be performed.

It is thus desired to provide a beam deflection system covering a wide scanning range with a plurality of laser light sources to realize beam control for concentrating a laser beam on a specific scanning range while limiting the number of laser light sources.

An aspect of the present disclosure described herein is set forth in the following clauses.

According to an aspect of the present disclosure, a beam deflection system is provided to include a beam deflector, a plurality of laser light sources, and a wavelength combiner. The beam deflector is configured to deflect a laser beam by changing a wavelength. The plurality of laser light sources are configured to respectively emit a plurality of laser lights. Each of the plurality of laser light sources is configured to switch two different center wavelengths to each other. A counted number of the plurality of laser light sources is 2M; the M is a positive integer more than one, the 2M laser light sources being divided into two sets of M types, the two sets are a first set of the M types and a second set of the M types. The wavelength combiner is configured to combine the laser lights emitted from the two sets of M types laser light sources to output a combined laser light to the beam deflector. Herein, in cases (i) N is defined as an integer satisfying an expression of $1 \leq N \leq M$, and (ii) the center wavelengths are each defined as $\lambda$, and the center wavelengths of Nth laser light sources of the two sets of M laser light sources are defined as $\lambda N$ and $\lambda M+N$, an expression of "$\lambda 1 < \ldots < \lambda N < \ldots < \lambda M < \lambda M+1 < \ldots < \lambda M+N < \ldots < \lambda 2M$" is satisfied.

According to the beam deflection system of such a configuration, during normal scanning, laser lights are emitted with a plurality of laser light sources having center wavelengths of $\lambda 1$ to $\lambda 2M$. This makes it possible to concurrently irradiate a plurality of consecutive scanning ranges with laser beams. Further, when performing beam control for concentrating the laser beams on a specific scanning range, the corresponding laser light sources of the same type of each set of M types are oscillated at the same center wavelength. As a result, even if only two sets of M types of laser light sources are provided, a plurality of laser light sources can be used to concurrently irradiate the same scanning range with laser beams.

Therefore, in a beam deflection system that covers a wide scanning range with a plurality of laser light sources, it is possible to realize beam control that concentrates the laser beams on a specific scanning range while limiting the number of laser light sources.

What is claimed is:

1. A beam deflection system comprising:
   a beam deflector configured to deflect a laser beam by changing a wavelength;
   a plurality of laser light sources configured to respectively emit a plurality of laser lights, each of the plurality of laser light sources being configured to switch two different center wavelengths to each other, wherein a counted number of the plurality of laser light sources being 2M, the M being a positive integer more than one, the 2M laser light sources being divided into M types of laser light sources; and
   a wavelength combiner configured to combine the laser lights emitted from M types of laser light sources to output a combined laser light to the beam deflector,
   wherein:
   each of M types of laser light sources is formed of a pair of two light sources,
   in the pair, each light source of the two light sources is configured to switch between two different center wavelengths so that the pair switchably emit two laser lights with the two different center wavelengths, and
   the wavelength combiner is configured to combine the two laser lights emitted from the pair of two light sources of each of M types of laser light sources, and input the combined laser lights to the beam deflector,
   wherein:
   (i) the center wavelengths are each defined as $\lambda$;
   (ii) N is defined as a positive integer satisfying an expression of "$2 \leq N \leq M-2$", where $4 \leq M$;
   (iii) the center wavelengths are enabled to be provided by each of Nth laser light sources of the M types of laser light sources and are defined as $\lambda N$ and $\lambda M+N$; and
   (iv) the M types of laser light sources are enabled to provide 2M center wavelengths that are provided to satisfy an expression of "$\lambda 1 < \lambda N < \lambda N+1 < \lambda M < \lambda M+1 < \lambda M+N < \lambda M+N+1 < \lambda 2M$";
   the beam deflection system being configured to switch between two center wavelengths based on two excitation levels of semiconductor to switchably yield a normal scanning range which is continuous and a concentrated scanning range which is continuous.

2. The beam deflection system according to claim 1, wherein:
   each of the plurality of laser light sources includes a laser gain medium providing a gain having a wavelength dependence with two maximum values.

3. The beam deflection system according to claim 2, wherein:
   the two different center wavelengths of the each of the pair of two laser light sources are oscillations due to an excited level of the laser gain medium, and oscillations due to a ground level of the laser gain medium.

4. The beam deflection system according to claim 1, wherein:
   each of the plurality of laser light sources includes a laser gain medium having a quantum dot structure.

5. A beam deflection system comprising:
   a beam deflector configured to deflect a laser beam by changing a wavelength;
   a first pair of laser light sources;
   a second pair of laser light sources; and
   a wavelength combiner,
   wherein:
   each of the laser light sources in the first pair is configured to emit switchably a first laser light with a center wavelength $\lambda 1$ and a second laser light with a center wavelength $\lambda 3$, each of the laser light sources in the second pair is configured to emit switchably a third laser light with a center wavelength λ2 and a fourth laser light with a center wavelength λ4, the wavelength combiner is configured to:
  combine laser lights emitted from the first pair of laser light sources and the second pair of laser light sources; and
  input the combined laser lights to the beam deflector wherein λ1<λ2<λ3<λ4.

6. A beam deflection system comprising:
a beam deflector configured to deflect a laser beam by changing a wavelength;
a first pair of laser light sources;
a second pair of laser light sources;
a third pair of laser light sources; and
a wavelength combiner,
wherein:
each of the laser light sources in the first pair is configured to emit switchably a first laser light with a center wavelength λ1 and a second laser light with a center wavelength λ4,
each of the laser light sources in the second pair is configured to emit switchably a third laser light with a center wavelength λ2 and a fourth laser light with a center wavelength λ5,
each of the laser light sources in the third pair is configured to emit switchably a fifth laser light with a center wavelength 3 and a sixth laser light with a center wavelength λ6, and
the wavelength combiner is configured to:
  combine laser lights emitted from the first pair of laser light sources, the second pair of laser light sources, and the third pair of laser light sources; and
  input the combined laser lights to the beam deflector, wherein λ1<λ2<λ3<λ4<λ5<λ6.

7. The beam deflection system according to claim 1, wherein:
each light source is configured to emit a single laser light.

8. The beam deflection system according to claim 5, wherein:
each of the laser light sources is configured to emit a single laser light.

9. The beam deflection system according to claim 6, wherein:
each of the laser light sources is configured to emit a single laser light.

10. The beam deflection system according to claim 7, further configured to switch laser oscillations of each light source between the two different center wavelengths including a first center wavelength and a second center wavelength, the first center wavelength corresponds to a wavelength of an excited level and the second center wavelength corresponds to a wavelength of a ground level.

11. The beam deflection system according to claim 1, wherein:
each light source is a single laser light source configured by an external laser resonator.

12. The beam deflection system according to claim 1, wherein:
each light source includes an optical filter and a semiconductor optical amplifier, light is emitted from the semiconductor optical amplifier to the optical filter and then output from the semiconductor optical amplifier as the laser light of the laser light source.

13. The beam deflection system according to claim 12, wherein:
the semiconductor optical amplifier includes a one face that is optically coupled to a waveguide of the optical filter, and a light emitting surface opposite to the one face, the light emitting surface reflects light inside the semiconductor optical filter and returns light to the semiconductor optical filter while emitting light from the semiconductor optical filter.

14. The beam deflection system according to claim 5, further configured to
in each of the light sources in the first pair, switch laser oscillations between two different center wavelengths including the center wavelength λ1 and the center wavelength λ3, the center wavelength λ1 corresponds to a wavelength of an excited level and the center wavelength λ3 corresponds to a wavelength of a ground level; and
in each of the light sources in the second pair, switch laser oscillations between two different center wavelengths including the center wavelength λ2 and the center wavelength λ4, the center wavelength λ2 corresponds to a wavelength of an excited level and the center wavelength λ4 corresponds to a wavelength of a ground level.

15. The beam deflection system according to claim 5, wherein:
each of the laser light sources is a single laser light source configured by an external laser resonator.

16. The beam deflection system according to claim 5, wherein:
each of the laser light sources includes an optical filter and a semiconductor optical amplifier, light is emitted from the semiconductor optical amplifier to the optical filter and then output from the semiconductor optical amplifier as the laser light of the laser light source.

17. The beam deflection system according to claim 16, wherein:
the semiconductor optical amplifier includes a one face that is optically coupled to a waveguide of the optical filter, and a light emitting surface opposite to the one face, the light emitting surface reflects light inside the semiconductor optical filter and returns light to the semiconductor optical filter while emitting light from the semiconductor optical filter.

18. The beam deflection system according to claim 6, further configured to
in each of the light sources in the first pair, switch laser oscillations between two different center wavelengths including the center wavelength λ1 and the center wavelength λ4, the center wavelength λ1 corresponds to a wavelength of an excited level and the center wavelength λ4 corresponds to a wavelength of a ground level;
in each of the light sources in the second pair, switch laser oscillations between two different center wavelengths including the center wavelength λ2 and the center wavelength λ5, the center wavelength λ2 corresponds to a wavelength of an excited level and the center wavelength λ5 corresponds to a wavelength of a ground level; and
in each of the light sources in the third pair, switch laser oscillations between two different center wavelengths including the center wavelength λ3 and the center wavelength λ6, the center wavelength λ3 corresponds to a wavelength of an excited level and the center wavelength λ6 corresponds to a wavelength of a ground level.

19. The beam deflection system according to claim 6, wherein:
  each of the laser light sources is a single laser light source configured by an external laser resonator.

20. The beam deflection system according to claim 6, wherein:
  each of the laser light sources includes an optical filter and a semiconductor optical amplifier, light is emitted from the semiconductor optical amplifier to the optical filter and then output from the semiconductor optical amplifier as the laser light of the laser light source.

* * * * *